United States Patent
Kim et al.

(12) 
(10) Patent No.: US 6,327,197 B1
(45) Date of Patent: Dec. 4, 2001

(54) STRUCTURE AND METHOD OF A COLUMN REDUNDANCY MEMORY

(75) Inventors: Juhan Kim, Cupertino; Hing Wong, Los Altos, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/660,534

(22) Filed: Sep. 13, 2000

(51) Int. Cl.[7] ................................................ G11C 7/00
(52) U.S. Cl. .................... 365/200; 365/201; 365/185.13; 365/185.09; 365/189.02
(58) Field of Search ........................... 365/200, 201, 365/185.13, 185.09, 185.11, 189.02, 230.02, 230.03, 230.04

(56) References Cited

U.S. PATENT DOCUMENTS 6,134,160  *  10/2000  Waller et al. ...................... 365/200
6,144,591  *  11/2000  Vlasenko et al. .................. 365/200
6,151,263  *  11/2000  Kyung et al. .................. 365/230.03

\* cited by examiner

*Primary Examiner*—David Nelms
*Assistant Examiner*—David Lam
(74) *Attorney, Agent, or Firm*—Fernandez & Associates LLP

(57) ABSTRACT

A memory architecture is disclosed that employs multiple column redundancies which provide multiple options for replacing a defective global odd or even bit line. Each column memory has two multiplexers, one for selecting a global odd bit line and another for selecting a global even bit line. Two or more column redundancies are coupled to each of the multiplexer in the column memory. In a first embodiment, the global odd and even bit lines are connected through odd and even sense amps in a regular column. In a second embodiment, the global odd bit line in a regular column connects through odd sense amps, while the global even bit line in the regular column connects through even sense amps. In a third embodiment, two or more sets of redundancy columns are commonly coupled to a left adjacent regular column and a right adjacent regular column.

9 Claims, 5 Drawing Sheets

STRUCTURE AND METHOD OF A COLUMN REDUNDANCY MEMORY

BACKGROUND OF THE INVENTION

1. Field of Invention

The present invention relates generally to integrated circuits, and more particularly to dynamic random-access memories (DRAMs).

2. Description of Related Art

Networking companies are scrambling in a race to design and develop high performance network processing products for the terabit router market while reducing the cost to implement 10 giga-bits per second/OC192 and above optical carrier network interfaces. Terabit routers demand a fatter throughput of data packets for examining an incoming packet, retrieves a next hop location, and transfers the packet to destination. Memory chips serve as integral components in building a fast network infrastructure. As designers and manufactures attempt to increase the capacity in high-density memory chips, a redundancy memory scheme represents a significant portion in the overall finctionalities of a memory chip.

In a conventional memory, the design is typically rigid in which one redundancy column is dedicated for replacing a particular defective memory column. Such scheme may be too limiting if several memory columns fail, which occur more frequently with high-density memories and wide IO DRAMs. Accordingly, it is desirable to have a memory structure that employs intelligent and flexible column redundancy designs for increasing the overall operations in DRAMs.

SUMMARY OF THE INVENTION

The present invention overcomes the foregoing limitations by disclosing a memory architecture that employs multiple column redundancies which provide multiple options for replacing a defective global odd or even bit line. Each column memory has two multiplexers, one for selecting a global odd bit line and another for selecting a global even bit line. Two or more column redundancies are coupled to each of the multiplexer in the column memory. In a first embodiment, the global odd and even bit lines are connected through odd and even sense amps in a regular column. In a second embodiment, the global odd bit line in a regular column connects through odd sense amps, while the global even bit line in the regular column connects through even sense amps. In a third embodiment, two or more sets of redundancy columns are commonly coupled to a left adjacent regular column and a right adjacent regular column.

Advantageously, the memory structure in the present invention increases the flexibility of column redundancy by n-folds in replacing defective global bit lines. The present invention also advantageously improves yields in the manufacturing of a memory chip, particularly for high-density memory devices.

DETAILED DESCRIPTION OF PREFERRED EMBODIMENTS

Figure 1:
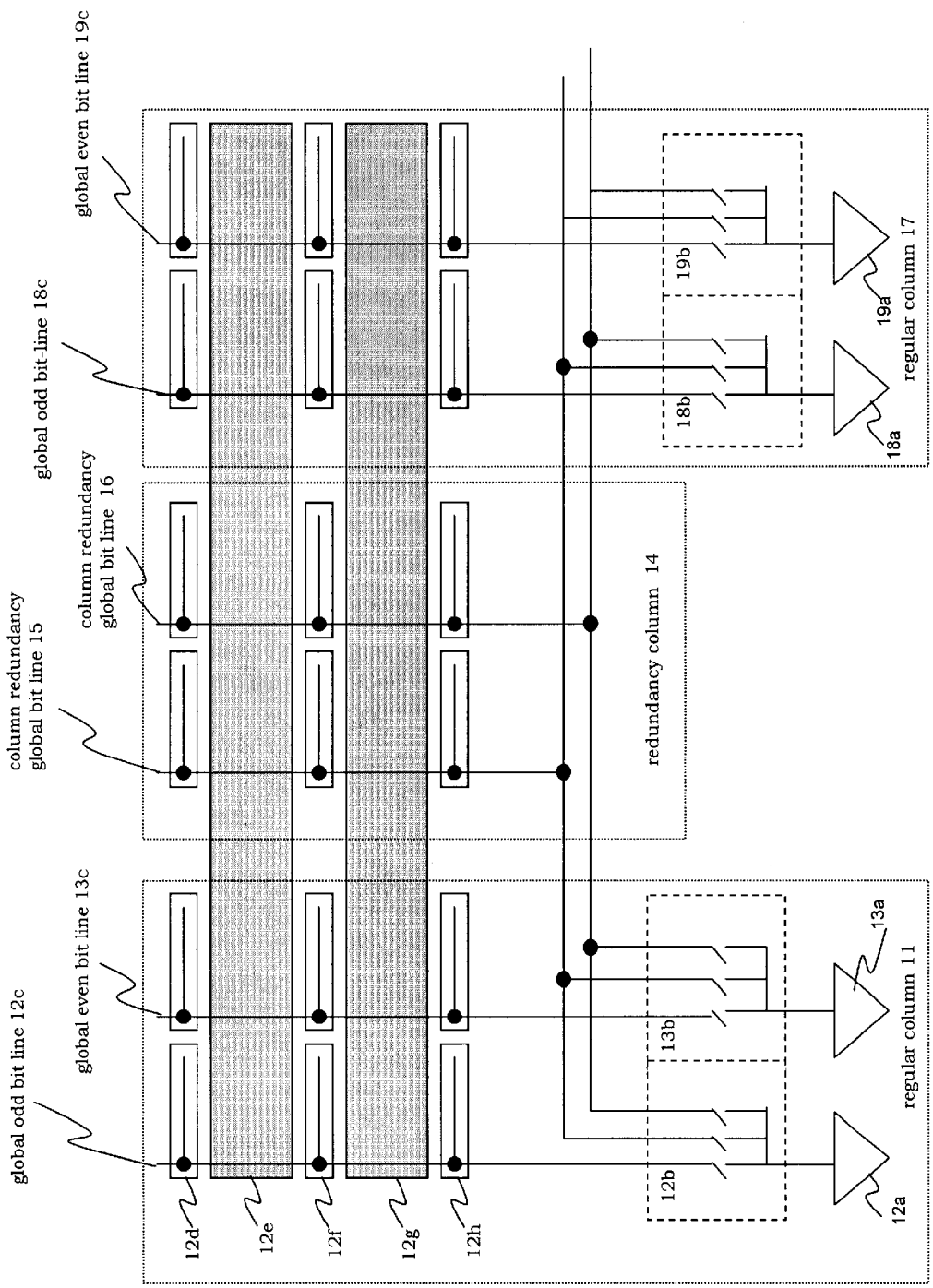
FIG. 1 is a schematic diagram illustrating a first embodiment of a column redundancy memory in accordance with the present invention.

FIG. 1 is a schematic diagram of a memory array 10 with flexible column redundancy memories, including a regular column 11, a redundancy column 14, and a regular column 17. The regular column 11 has a global odd bit line 12c that extends through a sense amp 12d, a memory cell 12e, a sense amp 12f, a memory cell 12g, and a sense amp 12h. The regular column 11 also has a global even bit line 13c that extends across similar data sense amps and memory cells. A multiplexer or switch 12b in the regular column 11 provides the flexibility to select one of three options in the global odd bit line 12c, a column redundancy global bit line 15, or a column redundancy global bit line 16, for generating an output through a sense amp 12a. If a defect or failure is detected on the global odd bit line 12c, the multiplexer 12b selects either the column redundancy 15 or column redundancy 16 to replace the defective global odd bit line 12c. By providing two column redundancies 15 and 16, the memory array 10 has double the flexibility in replacing a defective global bit line with either one of the two column redundancies 15 and 16. One of ordinary skill in the art should recognize that the redundancy column 14 may add additional column redundancy or redundancies to further increase the flexibility of the memory array 10 in replacing a defective global odd or even bit line. Similarly type of constructs is applied to the global even bit line 13c. When an even global bit line 13c fails, then the multiplexer 13b selects a redundancy column replacement for the failed global bit line 13c by either one of the two global column redundancy bit lines 15 or 16. The output from the multiplexer 13b is sent to a sense amp 13a. Preferably, the multiplexers 12b and 13b operate in tandem in which the multiplexer 12b has the first opportunity to select either the column redundancy 15 or 16 for replacing the defective global odd bit 12c, followed by the multiplexer 13b to select either the column redundancy 15 or 16 for replacing a defective global even bit line 13c provided that column redundancies 15 and 16 have not been selected by the multiplexer 12b already for use to replace the defective global odd bit line 12c.

A regular column 17 has two multiplexers 18b and 19b where each multiplexer 18b or 19c is coupled to the column redundancy 15 and the column redundancy 16. If column redundancies 15 and 16 have not been selected by multiplexer 12b or 12c in the regular column 11 for replacement, then the multiplexers 18b associated with a sense amp 18a and 19b associated with a sense amp 19a still has the options to use either the column redundancy 15 or column redundancy 16 to replace a global odd bit line 18c, or to replace a defective global even bit line 19c.

Figure 2:
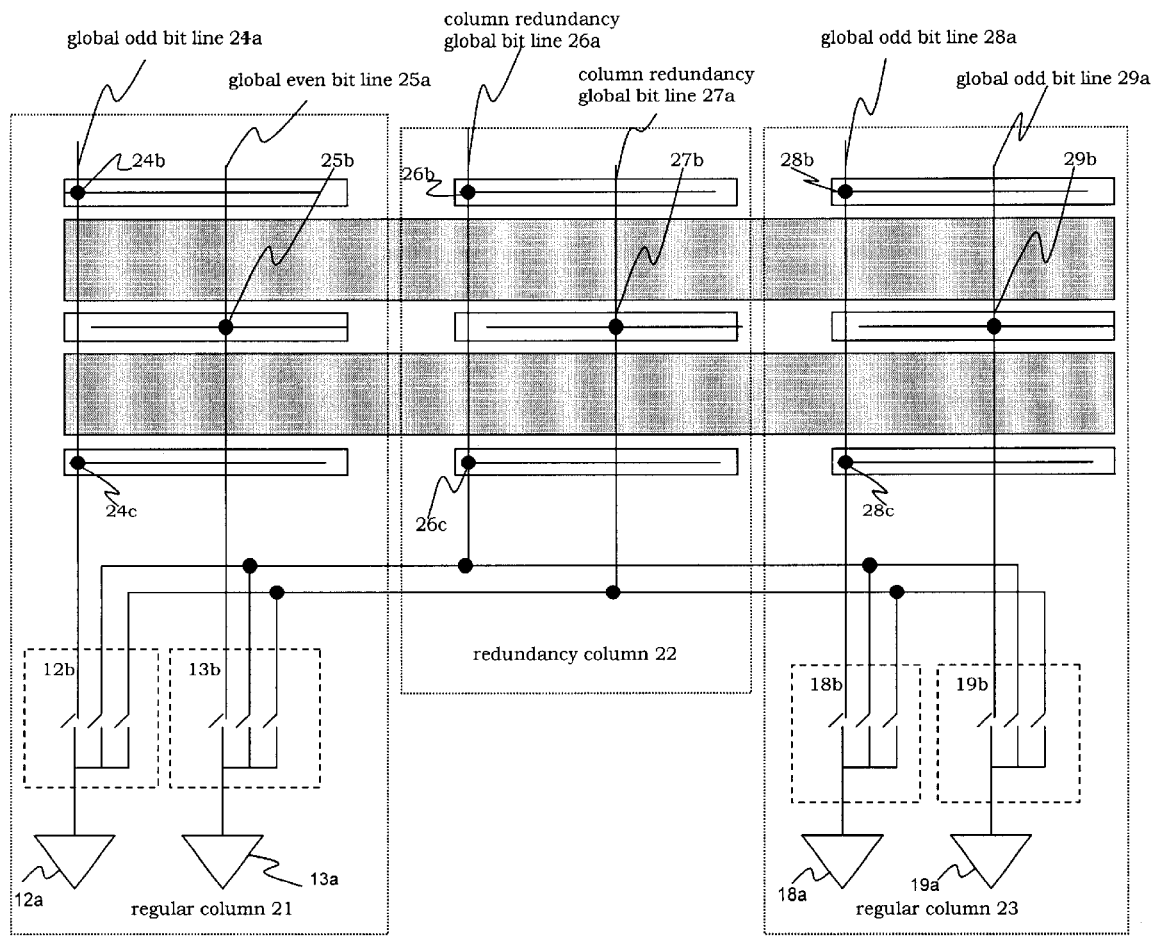
FIG. 2 is a schematic diagram illustrating a second embodiment of a column redundancy memory in accordance with the present invention.

FIG. 2 is a schematic diagram illustrating a second embodiment of a column redundancy memory 20 with a regular column 21, a redundancy column 22, and a regular column 23. A global odd bit line 24a connects to odd sense amps 24b and 24c, while a global even bit line 25a connects to an even sense amp 25b. To stated in another way, the global odd bit line 24a is not connected to the even sense amp 25b, and the global even bit line 25a is not connected to odd sense amps 24b and 24c. This type of constructs is also applied to redundant column 22. A column redundancy global bit line 26a connects to the odd sense amps 26b and 26c, and a column redundancy global bit line 27a connects to an even sense amp 27b. In the regular column 23, a global odd bit line 28a connects through odd sense amps 28a and 28c, with a global even bit line 29a connects to an even sense amp 29b.

Figure 3:
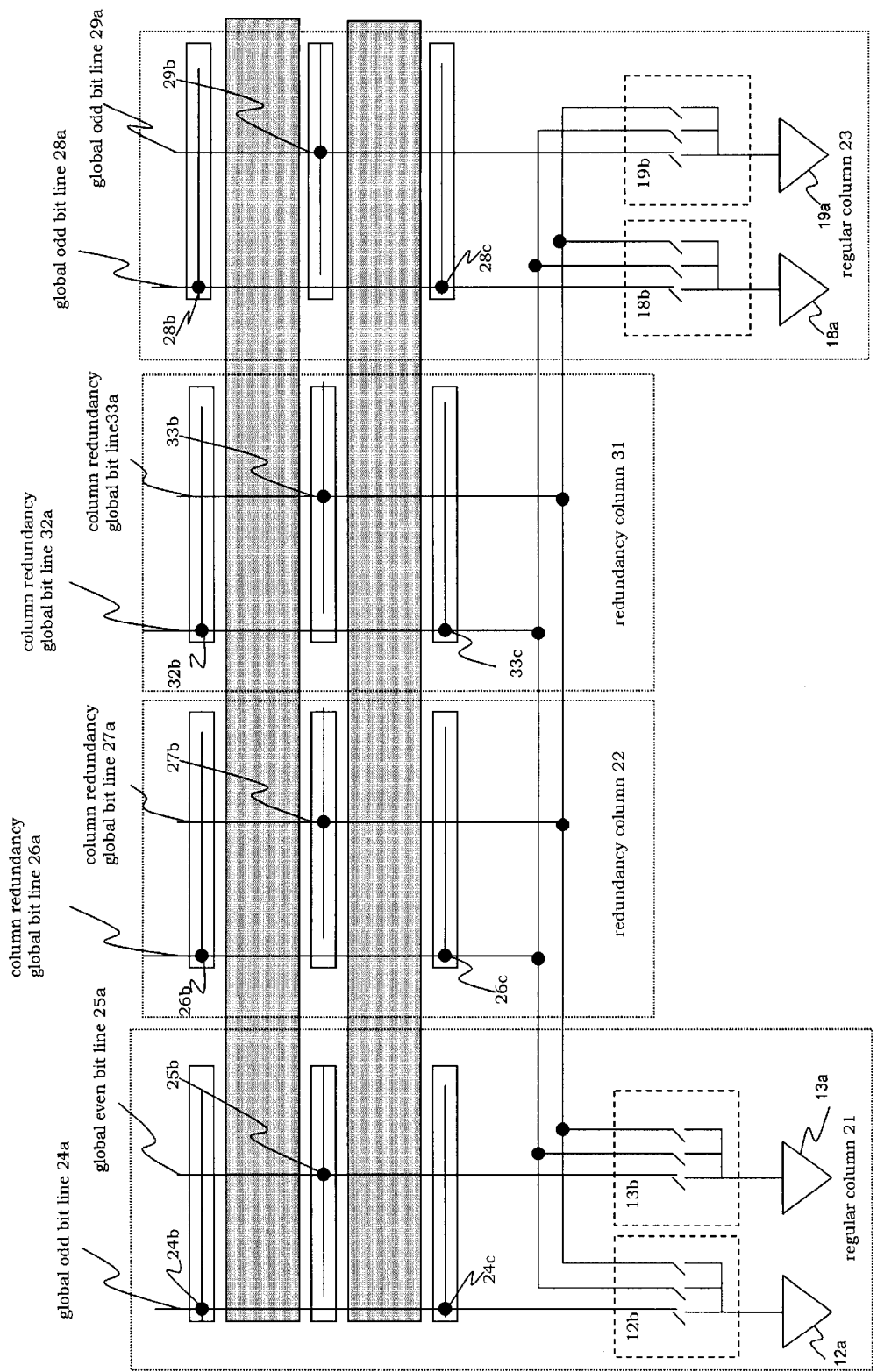
FIG. 3 is a schematic diagram illustrating a third embodiment of a column redundancy memo in accordance with the present invention.

FIG. 3 is a schematic diagram illustrating a third embodiment of a column redundancy memory 30. Another set of redundancy column 31 is added in the column redundancy memory 30 to further increase the flexibility and options for replacing a defective global bit line. Suppose if the column redundancy memory 30 does not have the additional redundancy column 31, that would leave just the redundancy column 22. The redundancy column 22 has two bit lines, namely the column redundancy global bit line 26a and the column redundancy global bit line 27a, for replacing four possible defective global bit lines in the global odd bit line 24a, the global even bit line 25a, the global odd bit line 28a, and the global odd bit line 29a. The column redundancy memory 30 thus implements the redundancy column 31, which has a column redundancy global bit line 32a connects to odd sense amps 32b and 32c, and the column redundancy global bit line 33a connects to an even sense amp 33b.

Figure 4:
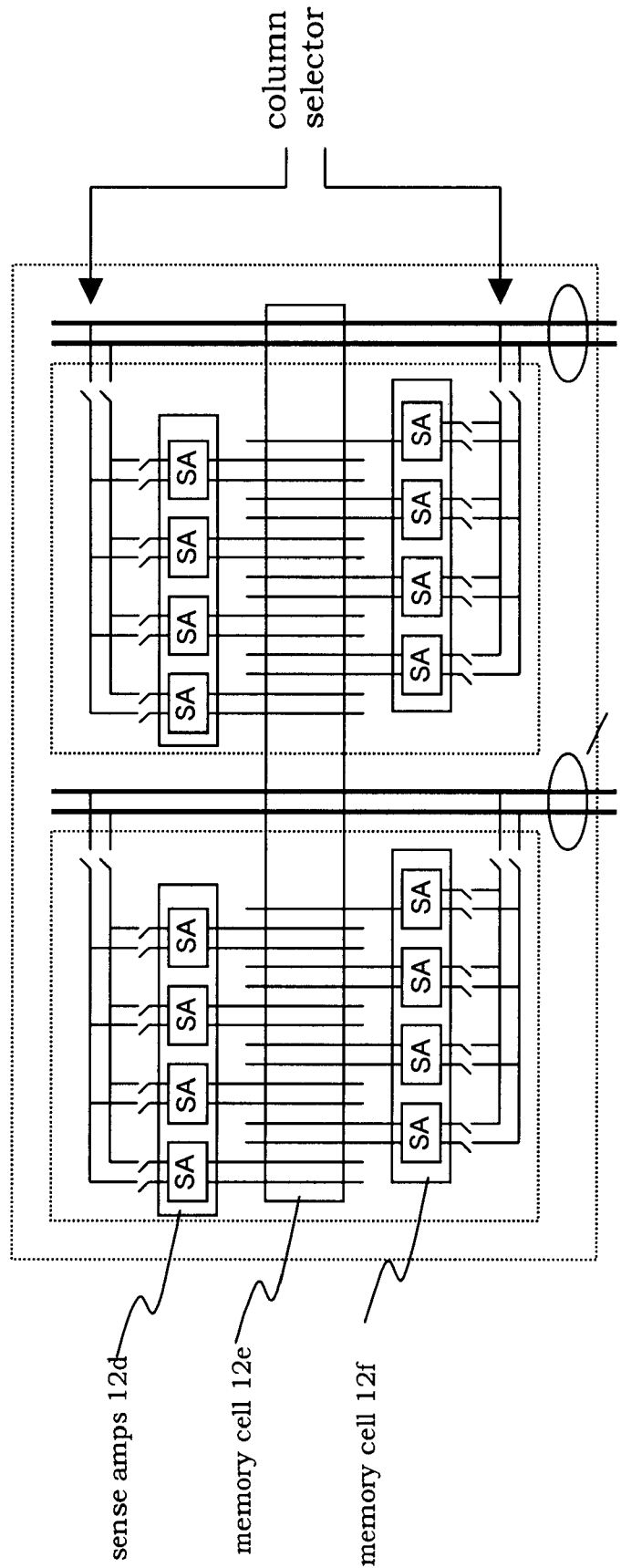
FIG. 4 is a schematic diagram illustrating sense amps and memory cells in the first embodiment in accordance with the present invention.

FIG. 4 is a schematic diagram 40 illustrating the sense amps and memory cells in the first embodiment. A plurality of sense amps 12d couples to a memory cell 12e that further couples to a plurality of sense amps 12f.

Figure 5:
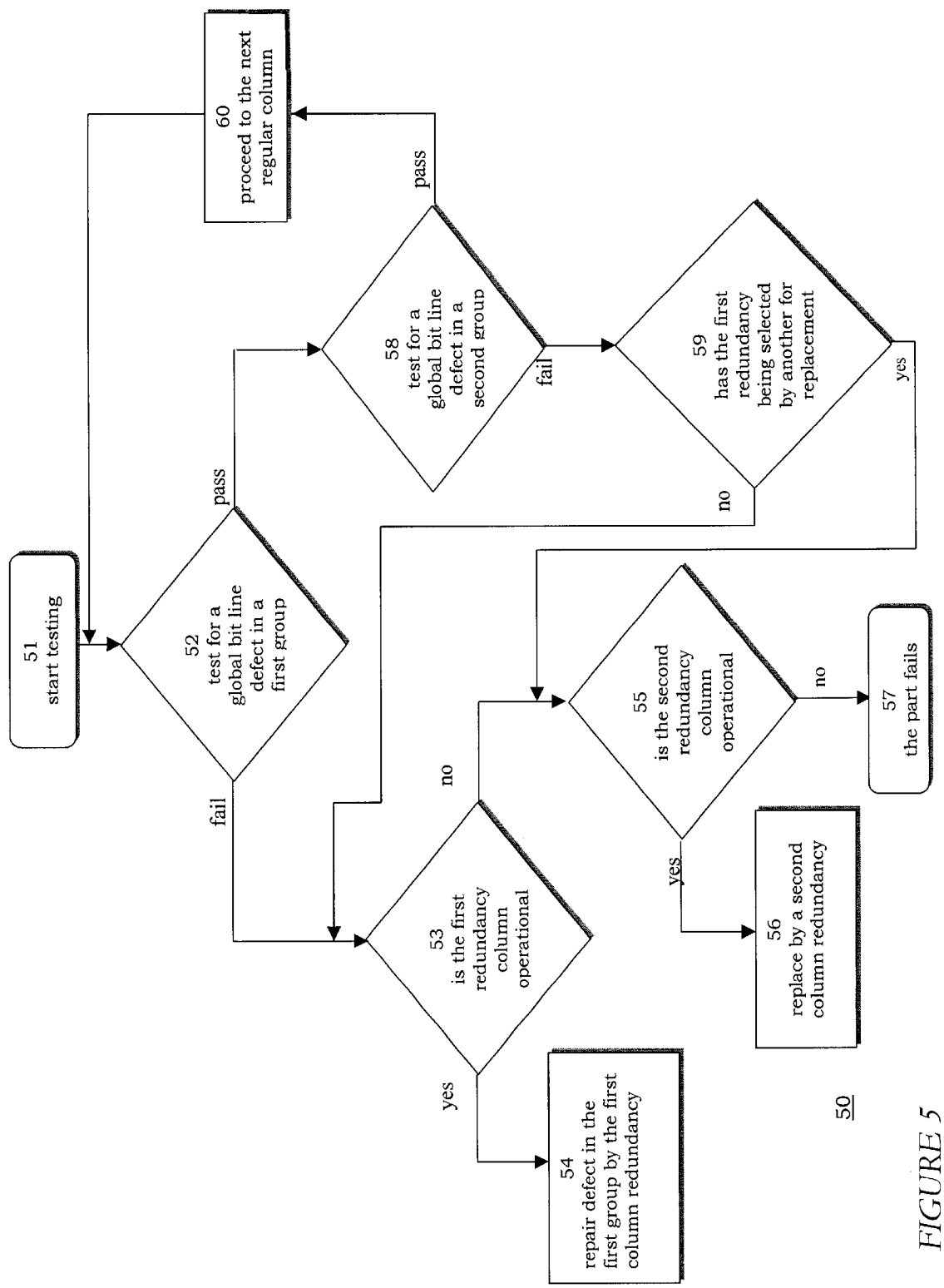
FIG. 5 is a flow diagram illustrating a process for repairing a column redundancy failure in accordance with the present invention.

FIG. 5 is a flow diagram illustrating a process 50 for repairing a column redundancy failure by begins at a step 51. The process 50 tests 52 for a global bit line defect in a first group, e.g. the global odd bit line 12c. If the global odd bit line 12c fails, the process determines 53 if a redundancy column is operational, e.g. the column redundancy global bit line 15. If the column redundancy global bit line 15 is operational, the process 50 repairs 54 the global odd bit line 12c in which the multiplexer 12b selects the column global bit line redundancy 15. However, if the column redundancy global bit line 15 also fails, then the process 50 continues to determine 55 if the second redundancy column is operational, e.g., the column redundancy global bit line 16c. If the column redundancy global bit line 16c is operational, the process 50 repairs 56 the global odd bit line 12c in which the multiplexer 12 selects the column redundancy global bit line 16c. If the second redundancy column also fails and there are no other options, then the memory array 10 fails 57.

If the process 50 determines 52 that the global bit line in a first group passes, then the process 50 tests 58 for a global bit line defect in a second group, e.g. the global even bit line 13c. If the global even bit line 13c fails, the process 50 determines 59 whether the first column redundancy global bit line 15 has already being selected by the multiplexer 12b for use to replace the global odd bit line 12c. On the one hand, if the column redundancy global bit line 15 is still available for use to replace a defect global bit line, then the process 50 continues to the step 53. On the other hand, if the column redundancy global bit line 15 has already been selected to replace the global odd bit line 12c, then the process 50 branches to the step 55. Finally, if the global even bit line 13c passes, the process 51 moves forward 60 to test the next regular column, e.g. the regular column 17.

Foregoing described embodiments of the invention are provided as illustrations and descriptions. They are not intended to limit the invention to precise form described. In particular, Applicants contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

We claim:

1. A memory structure, comprising:
   a regular column having a first global bit line and a second global bit line, the first and second global bit lines connecting through a plurality of sense amps and a plurality of memory cells;
   a redundancy column having a column redundancy odd global bit line and a column redundancy even global bit line, the column redundancy odd and even global bit lines connecting through a plurality of sense amps and a plurality of memory cells; and
   a first multiplexer having a first select input for connecting to the first odd global bit line, a second select input for connecting to the column redundancy odd global bit line, and a third select input for connecting to the column redundancy even global bit line, wherein if the first global bit line is defectives;
   a second multiplexer, the second multiplexer having a first select input connecting to the second global bit line, a second select input connecting to the odd redundancy column global bit line, and a third select input connecting to the second redundancy column global bit line, wherein if the second global bit line is defective, the second multiplexer selecting to route to either the first redundancy column global bit line or the second redundancy column global bit line, wherein if the first global bit line is defective, a second multiplexer selecting to route to either the odd redundancy column global bit line or the even redundancy column global bit line.

2. The memory structure of claim 1, wherein the second global bit line in the regular column comprises an even global bit line.

3. The integrated circuit of claim 1, wherein the first global bit line in the regular column comprises an odd global bit line.

4. The method for repairing a defective column in a memory array, comprising the steps of:
   detecting a defective global bit line; and
   replacing the defective global bit line by either a first redundancy column or a second redundancy column, comprising the steps of:
   if the first redundancy column is not defective, replacing the defective global bit line by the first redundancy column;
   if the second redundancy column is defective, replacing the defective global bit line by the second redundancy column.

5. An integrated circuit, comprising,
   a first regular column, comprising:
     a first multiplexer having a first select input for connecting to a first global bit line, a second select input, and a third select input; and
     a second multiplexer having a first select input for connecting to a second global bit line, a second input, and a third input;
   a first redundancy column, coupled to the first regular column, comprising:
     a first redundancy column global bit line commonly coupled to the second input of the first multiplexer in the first regular column and the second input of the second multiplexer in the first regular column; and a second redundancy column global bit line commonly coupled to the third input of the first multiplexer in the first regular column and the third input of the second multiplexer in the first regular column.

6. The integrated circuit of claim 5, further comprising a second redundancy column, the second redundancy column comprising:

a first column redundancy global bit line commonly coupled to the second input of the first multiplexer in the first regular column and the second input of the second multiplexer in the first regular column; and a second column redundancy global bit line commonly coupled to the third input of the first multiplexer in the first regular column and the third input of the second multiplexer in the first regular column.

7. The integrated circuit of claim 5, further comprising a second regular column, the second regular column comprising:

a first multiplexer having a first select input coupled to a first global bit line, a second select input, and a third select input; and a second multiplexer having a first select input coupled to a second global bit line, a second select input, and a third select input;

wherein the first redundancy column is commonly coupled to the second select input of the first multiplexer in the second regular column and the second input of the second multiplexer in the second regular column.

8. The integrated circuit of claim 5, wherein the first global bit line in the first regular column connecting through at least one odd sense amp and at least one even sense amp.

9. The integrated circuit of claim 5, wherein the first global bit line in the first regular column connecting to at least one odd sense amp, and wherein the second global bit line in the first regular column connecting to at least one even sense amp.

* * * * *